United States Patent
Jeon et al.

(10) Patent No.: US 8,233,851 B2
(45) Date of Patent: Jul. 31, 2012

(54) METHOD AND APPARATUS FOR PROVIDING IMPEDANCE MATCHING FOR HIGH-FREQUENCY SIGNAL TRANSMITTER

(75) Inventors: Joo Young Jeon, Ansan-si (KR); Sang Hwa Jung, Ansan (KR); Jung Hyun Kim, Seoul (KR); Young Kwon, Thousand Oaks, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 380 days.

(21) Appl. No.: 12/699,112

(22) Filed: Feb. 3, 2010

(65) Prior Publication Data
US 2011/0189964 A1     Aug. 4, 2011

(51) Int. Cl.
*H04B 1/04*        (2006.01)
*H04B 17/00*      (2006.01)

(52) U.S. Cl. ................ 455/114.3; 455/115.1; 455/114.2

(58) Field of Classification Search ............ 455/126, 455/127.2, 67.11, 115.1, 114.2, 125, 114.3; 330/192, 295
See application file for complete search history.

(56) References Cited

U.S. PATENT DOCUMENTS

| | | | |
|---|---|---|---|
| 5,564,086 A | 10/1996 | Cygan et al. | |
| 6,845,126 B2 * | 1/2005 | Dent et al. | 375/219 |
| 6,961,368 B2 * | 11/2005 | Dent et al. | 375/219 |
| 7,154,339 B2 * | 12/2006 | Kramer et al. | 330/295 |
| 7,319,364 B2 * | 1/2008 | Kim et al. | 330/295 |
| 7,408,408 B2 * | 8/2008 | Kang et al. | 330/149 |
| 2005/0227640 A1 | 10/2005 | Haque et al. | |
| 2012/0013401 A1 * | 1/2012 | Jeon et al. | 330/192 |

\* cited by examiner

*Primary Examiner* — Sonny Trinh

(57) ABSTRACT

In accordance with another representative embodiment, a high-frequency signal transmitter a power amplifier configured to supply a high-frequency signal; an antenna configured to transmit the high-frequency signal; a transmission line configured to transfer the high-frequency signal from the power amplifier to the antenna; and an impedance matching circuit connected to the transmission line. The high-frequency signal transmitter also comprises a mismatch detector. The mismatch detector is configured to designate a comparatively poor linearity region and a comparatively good linearity region by dividing a Smith chart into the two regions based on Adjacent Channel Power Ratio (ACPR) contours drawn on the Smith chart at a point on the transmission line where the impedance matching circuit is connected, to measure a time-dependent reflection coefficient of the high-frequency signal transmitter in terms of a phase and a magnitude, to determine whether the reflection coefficient is located in the comparatively poor linearity region or the comparatively good linearity region, and based on a result of the determination, to improve the linearity of the high-frequency signal transmitter.

12 Claims, 9 Drawing Sheets

CONDUCTANCE CIRCLE

PHASE OF THE LOAD REFLECTION COEFFICIENT

METHOD AND APPARATUS FOR PROVIDING IMPEDANCE MATCHING FOR HIGH-FREQUENCY SIGNAL TRANSMITTER

BACKGROUND

An impedance of an antenna in a high-frequency (or a radio-frequency) signal transmitter used in wireless communications is influenced by variances in the environment surrounding the antenna (for example, the approach of an automobile, or physical contact by a user, etc.). Variation in the impedance may cause a mismatch between the impedance of the antenna and that of a power amplifier supplying a signal to the antenna, and may adversely affect the performance of the wireless communications. In particular, such mismatch may generate a reflected signal component flowing from the antenna to the power amplifier, causing interference among signals within the signal transmitter, and a reduction in performance or efficiency of the signal transmitter.

As is known, an impedance matching between a power amplifier and an antenna (or a load) is an important parameter in achieving a linearity of a signal transmitter and ensuring a normal operation thereof. However, the signal transmitter linearity is influenced by a variation in the impedance of the antenna. Although an antenna for use in a general circuit has a particular impedance, it may be affected by and vary with changes in the surrounding environment (e.g., due to an approaching automobile which reflects signals transmitted from the antenna).

One way to reduce a variation in the impedance of an antenna to address a deterioration in the linearity of a signal transmitter and in the efficiency thereof, is to add an isolator between the antenna and the power amplifier to apply a substantially uniform load impedance to the power amplifier. Although the isolator may render it possible to provide a substantially uniform load impedance to the power amplifier, it may not be always practical to provide an isolator in a mobile communications device due to its size and/or extra cost.

What is needed therefore, is a method and apparatus to providing improved linearity in a signal transmitter that overcomes at least the deficiencies described above.

SUMMARY

In accordance with a representative embodiment, a method for improving linearity of a high-frequency signal transmitter is disclosed. The high-frequency signal transmitter comprises a power amplifier, an antenna, a transmission line for transferring a high-frequency signal from the power amplifier to the antenna, and an impedance matching circuit connected to the transmission line. The method comprises: designating a comparatively poor linearity region and a comparatively good linearity region by dividing a Smith chart into the two regions based on Adjacent Channel Power Ratio (ACPR) contours drawn on the Smith chart at a point on the transmission line where the impedance matching circuit is connected; measuring a reflection coefficient, capable of varying with time, of the high-frequency signal transmitter in terms of a phase and a magnitude; determining whether the reflection coefficient is located in the comparatively poor linearity region or the comparatively good linearity region; and improving or ensuring, based on a result of the determination, the linearity of the high-frequency signal transmitter.

In accordance with another representative embodiment, a high-frequency signal transmitter a power amplifier configured to supply a high-frequency signal; an antenna configured to transmit the high-frequency signal; a transmission line configured to transfer the high-frequency signal from the power amplifier to the antenna; and an impedance matching circuit connected to the transmission line. The high-frequency signal transmitter also comprises a mismatch detector. The mismatch detector is configured to designate a comparatively poor linearity region and a comparatively good linearity region by dividing a Smith chart into the two regions based on Adjacent Channel Power Ratio (ACPR) contours drawn on the Smith chart at a point on the transmission line where the impedance matching circuit is connected, to measure a time-dependent reflection coefficient of the high-frequency signal transmitter in terms of a phase and a magnitude, to determine whether the reflection coefficient is located in the comparatively poor linearity region or the comparatively good linearity region, and based on a result of the determination, to improve the linearity of the high-frequency signal transmitter.

BRIEF DESCRIPTION OF THE DRAWINGS

The representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, the present teachings relate to a method and apparatus for matching impedance between a power amplifier and an antenna of a high-frequency signal transmitter. In representative embodiments a reflection coefficient of the signal transmitter is determined, a location of the reflection coefficient on a Smith chart is determined, and a matching circuit is manipulated in response to a feedback control signal, to improve a linearity of the high-frequency signal transmitter.

Figure 1:
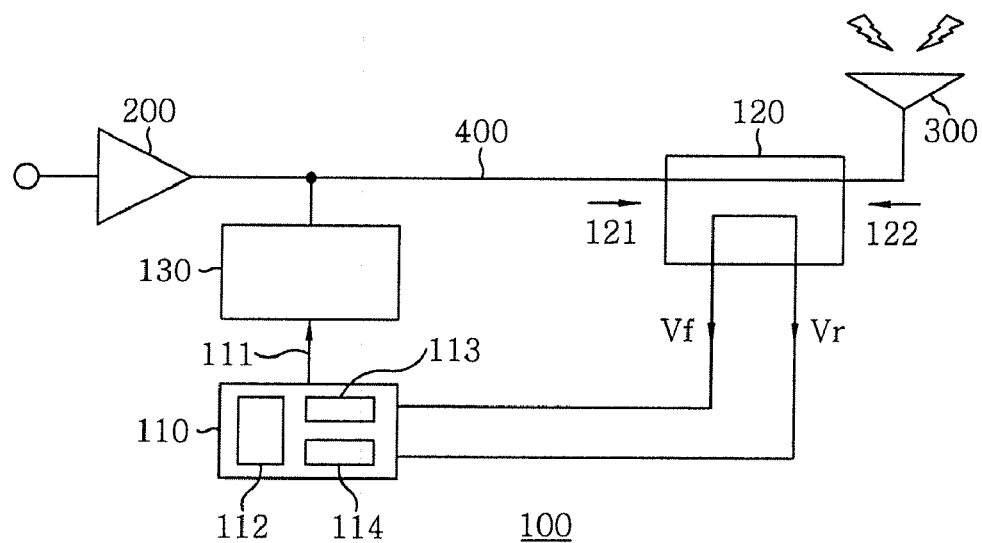
FIG. 1 shows a simplified schematic diagram of a signal transmitter in accordance with a representative embodiment.

FIG. 1 shows a simplified schematic diagram of a signal transmitter 100 in accordance with a representative embodiment. The signal transmitter 100 is designed to perform an impedance matching between a load 300 and a signal supply circuit 200 for supplying signals to the load 300 and includes a mismatch detector 110, a directional coupler 120 and a matching circuit 130. This matching circuit 130 may be an additional matching circuit which is provided separately from an existing typical matching circuit (not shown) disposed between the signal supply circuit 200 and the load 300. Furthermore, the signal supply circuit 200 and the load 300 are connected via a transmission line 400. For example, an antenna may be used as the load 300, and a power amplifier may be used as the signal supply circuit 200. Signals supplied by the power amplifier 200 may be high-frequency signals which are transmitted by the antenna 300 to perform wireless communications.

Figure 2A:
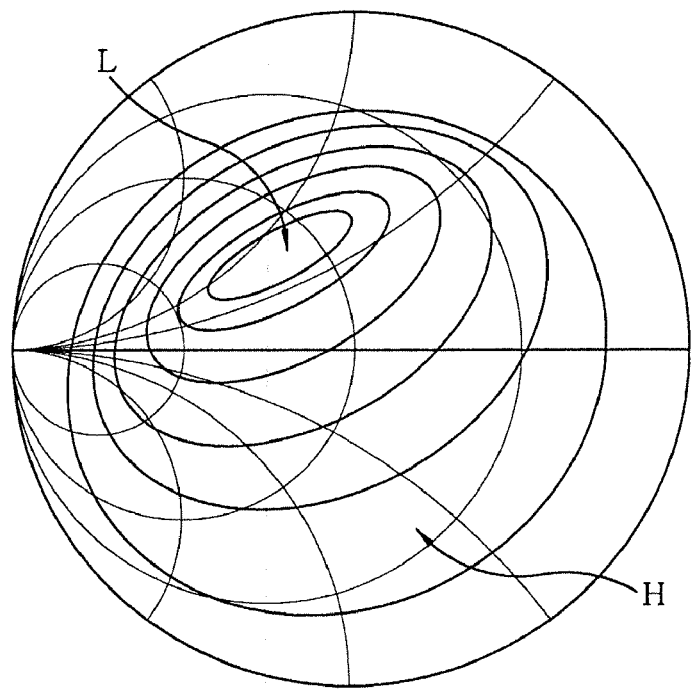
FIGS. 2A, 2B and 2C show illustrative sets of ACPR contours drawn on Smith charts.
Figure 2B:
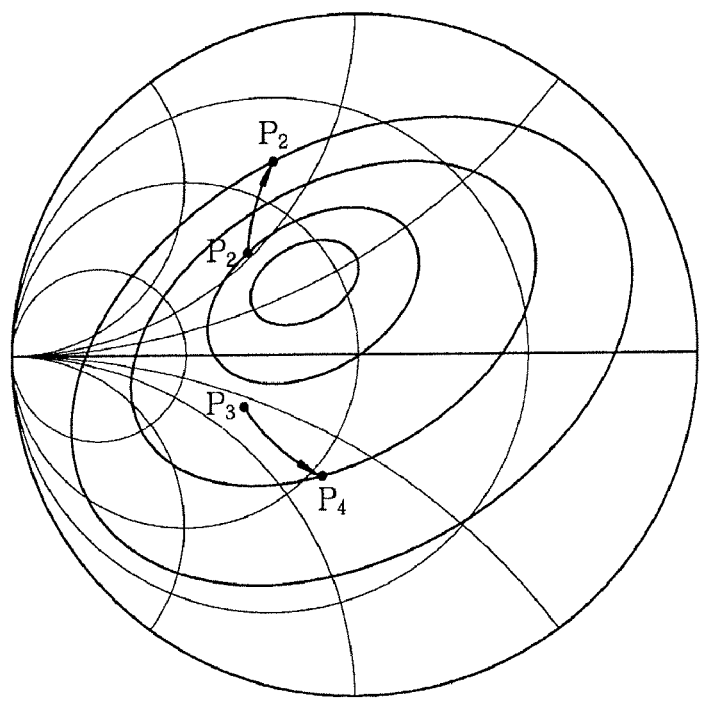
Figure 2C:
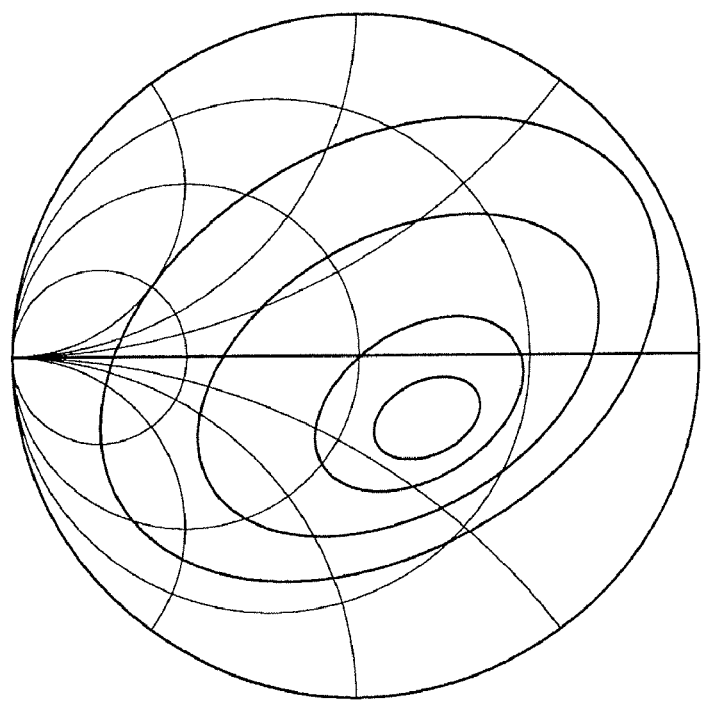

Adjacent-Channel Power Ratio (ACPR) of even a same output circuit may vary depending on the impedance of a load which is connected to the output circuit. FIGS. 2A to 2C show illustrative sets of ACPR contours drawn by successively linking impedances of loads having a same ACPR on Smith charts.

Referring to FIG. 2A, a region which includes a center of ACPR contours and is denoted by 'L' is a low-ACPR value region, and another region which lies in an outer side of the ACPR contours and is denoted by 'H' is a high-ACPR value region. In general, since an ACPR has a negative value, the lower the ACPR is, the lower the power of an adjacent channel is. Since the linearity and power efficiency of a signal transmitter and an electric circuit are inversely proportional to the amount of the power of an adjacent channel, it can be seen that the linearity of the region 'L' is better than that of the region 'H'.

ACPR contours may be drawn by applying sample loads having various impedances to an output circuit by using, for example, a load-pulling device, measuring ACPRs of the sample loads and connecting the sample loads having a same ACPR on a Smith chart using an interpolation method.

With reference to the signal transmitter 100 of FIG. 1, assuming that the electrical characteristics of the signal transmission line 400 connecting the power amplifier 200 with the antenna 300 are substantially ideal and the impedance of the signal transmission line 400 is zero, the shape of ACPR contours will be constant regardless of a location on the transmission line 400 at which a reference plane for drawing the ACPR contours thereon is set. However, the impedance of the transmission line 400 in actual use is not zero, causing and influencing reflection signals transmitted therethrough. As a result, the shape of the ACPR contours may vary depending on the location of the point on the transmission line 400 at which the reference plane for drawing the ACPR contours is set.

A Smith chart on which ACPR contours are drawn generally includes one portion where intervals between the ACPR contours are relatively narrow and another portion where the intervals are relatively wide. In the present embodiment, the matching circuit 130 is preferably disposed at a specific point on the transmission line 400 so that ACPR contours are drawn on a Smith chart at the specific point and the portion where intervals between the ACPR contours are narrow is not located in a lower half circle of the Smith chart, unlike that shown in FIG. 2C, but located in an upper half circle, like that shown in FIG. 2B. Stated somewhat differently, the location on the transmission line 400 at which the matching circuit 130 is connected to the transmission line 400 is selected by detecting a specific point where the portion having relatively narrow intervals between ACPR contours is located in the upper half circle of a Smith chart.

Furthermore, in the present embodiment, a reflection coefficient (or a load impedance) of the signal transmitter 100 may be adjusted based on ACPR contours drawn at a point where the matching circuit 130 is connected to the transmission line 400. Since, however, a point where an actual reflection coefficient is measured may be a point at which the directional coupler 120, shown in FIG. 1, is connected to the transmission line 400, the point where the ACPR contours (based on which the adjustment is to be made) are drawn may be somewhat different from the point where the actual reflection coefficient is measured, which may cause an error in the adjustment. However, the difference may be compensated by taking an appropriate measure, such as applying a phase offset when designing the mismatch detector 110. Accordingly, all ACPR contours, referred to below, may be assumed to have been drawn at the exact point where the matching circuit 130 is connected.

The power amplifier 200, the antenna 300 and the transmission line 400 of the signal transmitter 100 to which the present embodiment pertains are designed prior to determining where to place the mismatch detector 110, the directional coupler 120 and the matching circuit 130. Therefore, a specific point on the transmission line 400 for a reference plane for drawing ACPR contours thereon as shown in FIG. 2B may be first selected by a theoretical calculation or empirically based on the pre-designed elements only, and then, the elements of the signal transmitter 100, in particular, the matching circuit 130, may be disposed on an appropriate point. For example, since ACPR contours on a Smith chart are rotated by continuously moving the connection location of the matching circuit 130 along the transmission line 400, the appropriate point can be selected, through a plurality of experiments varying the location of the matching circuit 130, such that the portion where intervals between the ACPR contours are narrow is placed in an upper half circle of the Smith chart.

In the following description, a detailed scheme for measuring a reflection coefficient in terms of a phase and a magnitude and matching an impedance between the power amplifier 200 and the antenna 300 will be described.

While the signal transmitter 100 is in operation, the directional coupler 120 samples an incident signal 121 proceeding from the power amplifier 200 to the antenna 300 and a reflection signal 122 proceeding from the antenna 300 to the power amplifier 200, and transmits the sampling results to the mismatch detector 110. Then, the mismatch detector 110 measures a reflection coefficient from the sampling results.

Thereafter, a comparatively poor linearity region and a comparatively good linearity region are designated on a Smith chart. If the measured reflection coefficient belongs to the comparatively poor linearity region, the mismatch detector 110 improves the linearity by moving the reflection coefficient to the comparatively good linearity region by manipulating the matching circuit 130 in response to a feedback control signal 111 as indicated in FIG. 1.

Figure 3:
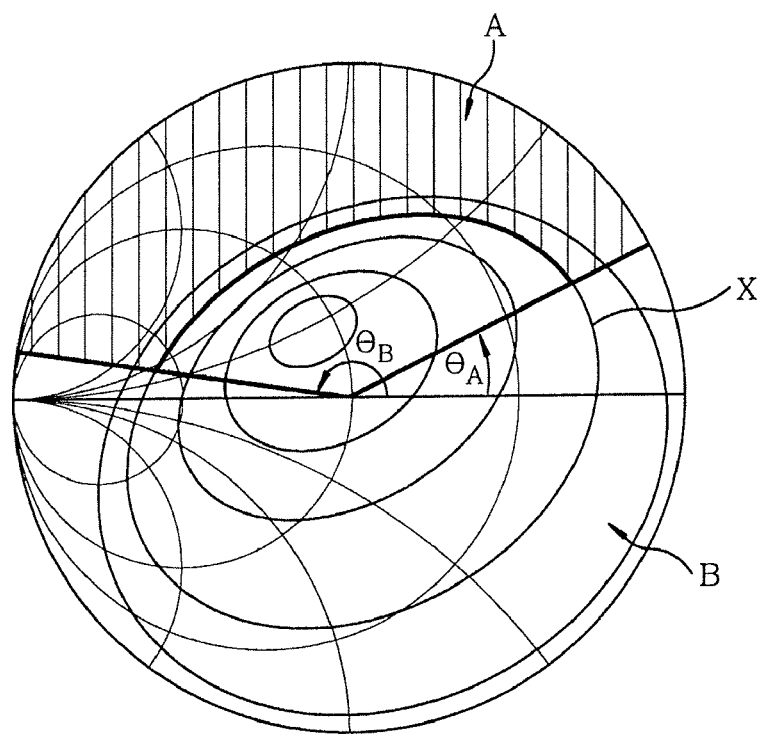
FIG. 3 shows an example of dividing a Smith chart into a comparatively good linearity region and a comparatively poor linearity region in accordance with a representative embodiment.

The division of a comparatively poor linearity region and a comparatively good linearity region on a Smith chart may be made by employing, for example, a reference ACPR contour X, a first reference phase $\theta_A$, and a second reference phase $\theta_B$ which is greater than the first reference phase $\theta_A$, as shown in FIG. 3. In the Smith chart, a region having a linearity worse than that of the reference ACPR contour X, that is, a region which has magnitudes lying outside the reference contour X, and has phases lying between the first reference phase $\theta_A$ and the second reference phase $\theta_B$ is designated as a comparatively poor linearity region. And, the remaining region is designated as a comparatively good linearity region. In FIG. 3, the lined region A represents the comparatively poor linearity region, and the non-lined region B denotes the comparatively good linearity region.

Consequently, the comparatively good linearity region includes not only a region which actually has a comparatively good linearity but also a region which is placed on an outer portion of the Smith chart reduced linearity. However, since the reflection coefficient is far less likely to be located in the latter region, it is not necessary to take that into consideration when a signal transmission circuit is designed.

Specifically, the first reference phase $\theta_A$ and the second reference phase $\theta_B$ are determined such that a portion in which the intervals between the ACPR contours are relatively narrow is located in a range between the first reference phase $\theta_A$ and the second reference phase $\theta_B$, which is designated as the comparatively poor linearity region as set forth above. As a result, the portion in which the intervals between the ACPR contours are relatively narrow is designated as the comparatively poor linearity region, whereas the portion in which the intervals between ACPR contours are relatively wide is designated as the comparatively good linearity region.

Further, a phase difference between the first reference phase $\theta_A$ and the second reference phase $\theta_B$ may be smaller than 180° so as to make the comparatively poor linearity region smaller than the comparatively good linearity region.

Figure 4:
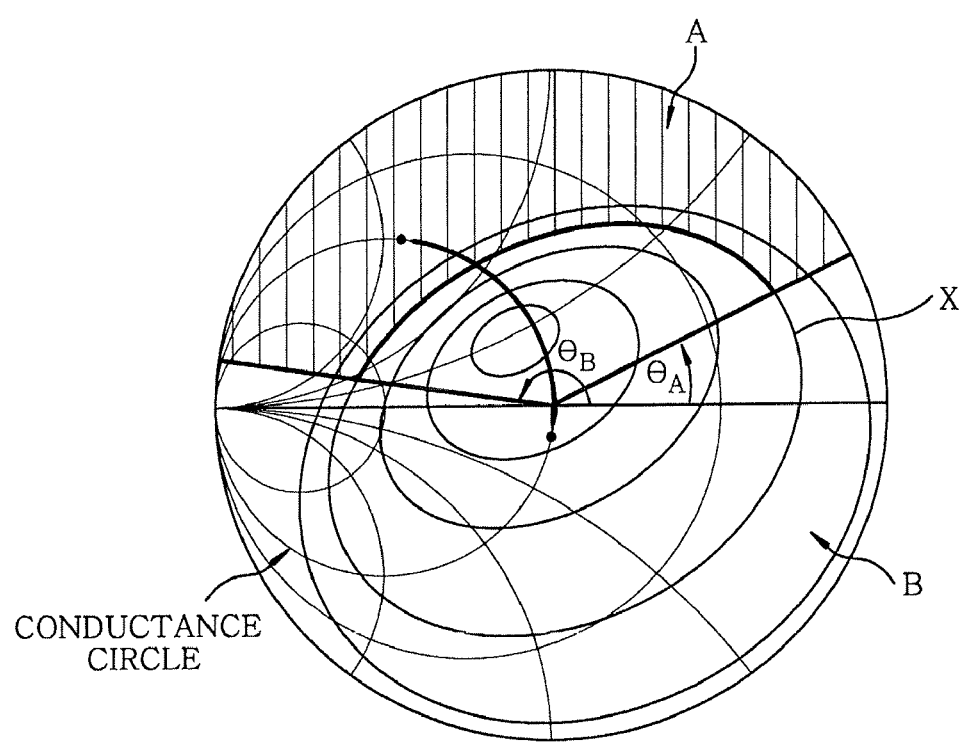
FIG. 4 shows an exemplary process of moving a reflection coefficient from the comparatively poor linearity region to the comparatively good linearity region in accordance in accordance with a representative embodiment.

When the mismatch detector 110 detects that the measured reflection coefficient is located in the comparatively poor linearity region as described above, the mismatch detector 110 manipulates the matching circuit 130 by transmitting the feedback control signal 111 thereto, so that the reflection coefficient is moved to the comparatively good linearity region as shown in FIG. 4. This process will be described further below.

Figure 5:
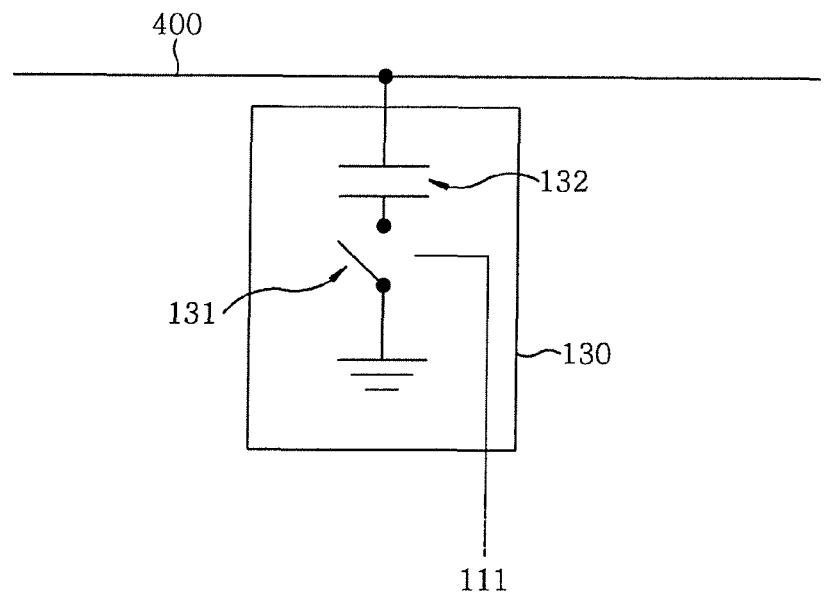
FIG. 5 is a detailed diagram showing an impedance matching circuit in accordance with in accordance with a representative embodiment.

A conventional impedance matching circuit has a complicated configuration including a plurality of inductors, capacitors and phase shifters, whereas the impedance matching circuit 130 in accordance with the present embodiment utilizes only a single capacitor, as shown in FIG. 5.

As described above, when the reflection coefficient is detected to belong to the comparatively poor linearity region, the mismatch detector 110 transmits the feedback control signal 111 to the matching circuit 130, and the matching circuit 130 moves the reflection coefficient to the comparatively good linearity region. The inventive method of performing the movement will now be described.

Once the matching circuit 130 connects one end of the shunt capacitor 132 to the transmission line 400 and connects the other end to ground, the reflection coefficient is rotated along a G circle (or a conductance circle) on an admittance Smith chart in a clockwise direction and in a downward direction, as indicated in FIG. 4. As a result, the reflection coefficient is moved from the comparatively poor linearity region to the comparatively good linearity region. The connection of the shunt capacitor 132 may be performed, for example, in such a manner that the switch 131 between the capacitor 132 and the grounding is turned on in response to the feedback control signal 111.

The capacitance of the shunt capacitor 132 may be appropriately adjusted by a circuit designer. Once the location of a reference plane on the transmission line is selected, the shape of ACPR contours drawn on the Smith chart and the location of an original reflection coefficient, without any influences from the surrounding environment, will be determined. Then, a comparatively poor and comparatively good linearity regions are designated based on the shape of the ACPR contours. Since the circuit designer can predict a range within the comparatively poor linearity region where the reflection coefficient is likely to fall due to changes in the surrounding environment, the capacitance of the shunt capacitor 132 which is sufficient to move the reflection coefficient from the comparatively poor linearity region to the comparatively good linearity region may be determined by using a common method of designing an impedance matching circuit using a Smith chart.

Since the embodiment uses only one shunt capacitor 132 to move the reflection coefficient from the comparatively poor linearity region to the comparatively good linearity region as described above, there may be raised a concern that it may be difficult to perform a precise control. However, since the comparatively good linearity region is wider than the comparatively poor linearity region as shown in FIG. 3 and is insensitive to an environmental change, a slightly imprecise control would not significantly compromise the ability to improve the linearity by way of moving the reflection coefficient to a desired location having a target ACPR.

The difference between a region in which intervals between ACPR contours are narrow and a region in which the intervals are wide will now be described. If the reflection coefficient is located in a region where the intervals between ACPR contours are excessively narrow, the ACPR may change greatly because the reflection coefficient passes through a large number of ACPR contours even when the reflection coefficient moves a short distance on the Smith chart. Accordingly, the linearity of a circuit whose reflection coefficient is located in a region of narrow intervals is sensitive to a change in the environment surrounding the antenna and, therefore, the desired performance may not be achieved unless a precise control is performed. For example, referring to FIG. 2B, when both P1 and P2 belong to the region where the intervals between the ACPR contours are narrow, ACPR of the reflection coefficient at P1 is greatly different from that at P2.

In contrast, however, when both P3 and P4 belong to a region where the intervals between the ACPR contours are wide, ACPR of the reflection coefficient at P3 is not greatly different from that at P4.

Accordingly, in accordance with the present embodiment, without going through an elaborate process choosing a capacitor having a capacitance that is the most suitable for an accurate location of the measured reflection coefficient in the comparatively poor linearity region, the reflection coefficient can be moved with only one capacitor having a fixed capacitance to the comparatively good linearity region, while still achieving the goal of improving the linearity.

Since the present embodiment enables the reflection coefficient to move from the comparatively poor linearity region to the comparatively good linearity region by using a simple element, i.e., a single shunt capacitor 132, it has the distinct advantage of improving the linearity at a low cost using a simple circuit design.

Furthermore, although the impedance of the antenna 300 may vary with changes in the environment surrounding the antenna 300, for example, presence of a wall against which the high-frequency signal is reflected, the intervals between the ACPR contours are relatively wide in the comparatively good linearity region which would be a target region to which the reflection coefficient is to be moved and, therefore, despite variations in the impedance, the linearity would not vary greatly. As a result, the transmitter 100 of the present embodiment is not sensitive to changes in the environment surrounding the antenna 300, to thereby render it possible to construct a reliable circuit for the transmitter 100.

If the region where the intervals between the ACPR contours are narrow is not located in the upper half circle of the Smith chart as shown in FIG. 2C, the ACPR contours may be rotated by adjusting the connection point of the matching circuit 130 along the transmission line 400 as described above and shown in FIG. 2B; sometimes, however, it may be difficult to sufficiently rotate the ACPR contours due to certain restrictions, such as a limited length of the transmission line 400. In preparation for such contingency, there is provided another preferred embodiment in which the ACPR contours can be sufficiently rotated, as explained below.

Figure 6:
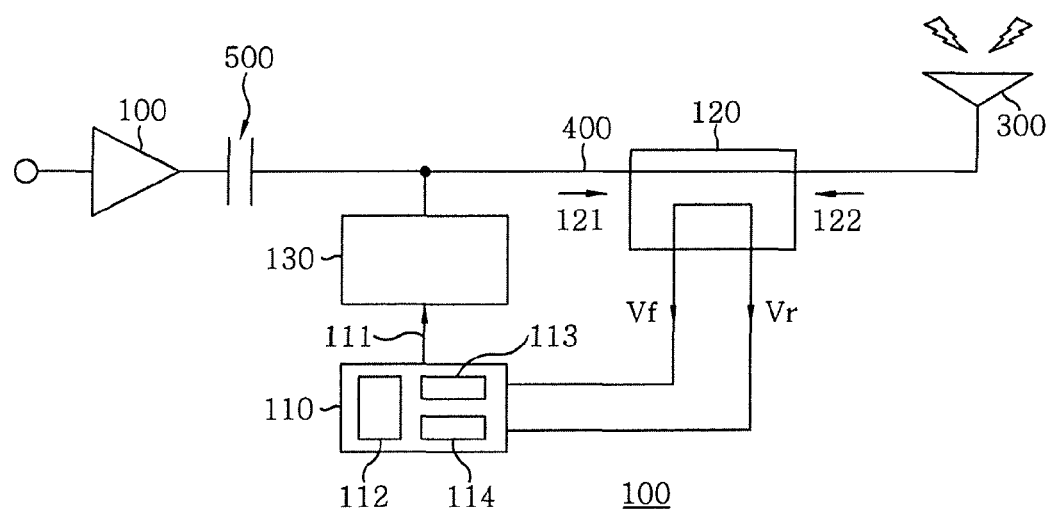
FIG. 6 is a block diagram showing a schematic configuration of a signal transmitter including a DC blocking capacitor in accordance with another representative embodiment.

FIG. 6 shows a schematic configuration of a signal transmitter 100 in accordance with said another representative embodiment. In order to move a comparatively poor linearity region of ACPR contours from a lower half circle to an upper half circle of a Smith chart, a DC blocking capacitor 500, shown in FIG. 6, may be used. Same component parts as in the preceding embodiment will be designated by like reference characters and their specific descriptions will be omitted.

A DC blocking capacitor is generally disposed between a power amplifier and an antenna of a wireless high-frequency signal transmitter. Supply of DC current is essential to supplying electric power to various components of the signal transmitter. If a DC leakage current accidentally flows into the antenna, the current may adversely affect the performance of the antenna and, in the worst case, may even destroy it. To prevent such mishap, therefore, a DC blocking capacitor is normally used in a transmitter circuit. The present embodiment makes use of such DC blocking capacitor commonly present in a transmitter for the task of moving a narrow interval region of ACPR contours from a lower half circle to an upper half circle of a Smith chart.

When a capacitor is connected in series to the circuit, ACPR contours are rotated along a resistance circle (or R-circle) on an impedance Smith chart in a clockwise direction. The DC blocking capacitor 500 which is adjusted to have an appropriate value and connected on the transmission line 400 between the power amplifier 100 and the matching circuit 130 rotates the ACPR contours whose narrow interval region is located in the lower half circle of the Smith chart as shown in FIG. 2C, to move the narrow interval region to the upper half circle, as shown in FIG. 2B. Thereafter, measurement of the reflection coefficient, operation of the matching circuit 130 and movement of the reflection coefficient are performed, as described above.

The capacitance of the DC blocking capacitor 500 may be set to an appropriate value by a circuit designer. For example, the capacitance may vary depending on the shape of ACPR contours on a reference plane. Specifically, it would be necessary for the capacitance to have a magnitude which is sufficient for ACPR contours to move from the lower half circle to the upper half circle.

Figure 7:
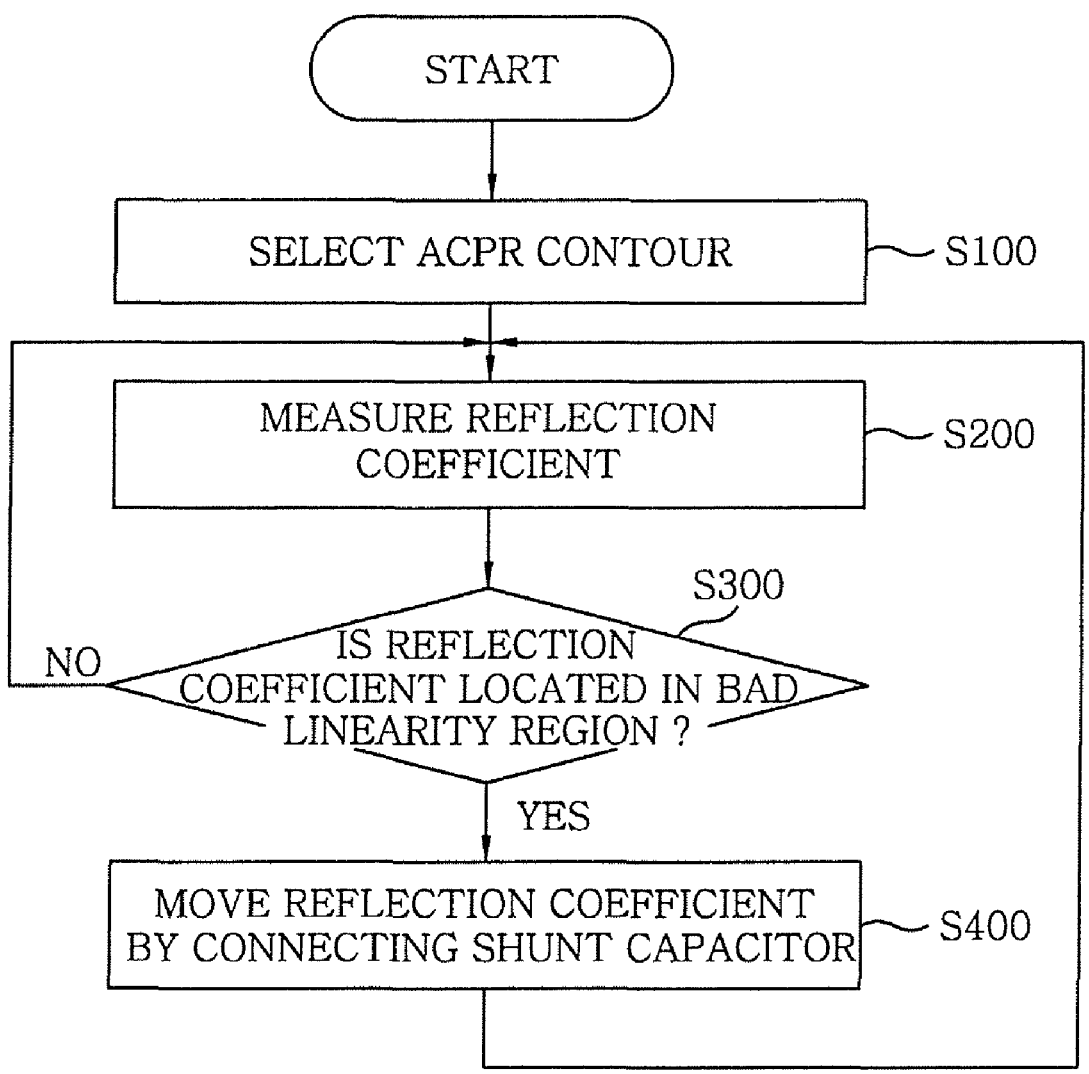
FIG. 7 is a flowchart showing an impedance matching process in accordance with representative embodiments.

FIG. 7 is a flowchart showing an impedance matching process in accordance with a representative embodiment. First, a region where intervals between ACPR contours are narrow is located in an upper half circle of a Smith chart is selected by adjusting a connection point of the matching circuit on the transmission line or by using a DC blocking capacitor at step S100. Thereafter, a reflection coefficient is measured at step S200. If the reflection coefficient is determined to belong to a comparatively poor linearity region at step S300, the reflection coefficient is moved to a comparatively good linearity region by connecting a shunt capacitor to the transmission line at step S400. Then, the impedance matching process may return to step S200 to measure the reflection coefficient again, which might vary with time while the signal transmitter is kept in operation. If the reflection coefficient is determined not to belong to the comparatively poor linearity region at step S300, the impedance matching process also returns to step S200 to measure the reflection coefficient again.

A shunt inductor may be used instead of the shunt capacitor 132 depending on the circuit design environment, to achieve a similar technical effect. In such case, the reflection coefficient is rotated along a conductance circle on an admittance Smith chart in a direction opposite that of the case of using the shunt capacitor 132, i.e., in a counterclockwise direction. Accordingly, unlike the case where the shunt capacitor 132 is used, a shunt inductor may be used to perform an impedance matching under a condition that a comparatively poor linearity region is located in the lower half circle of the Smith chart.

Figure 8A:
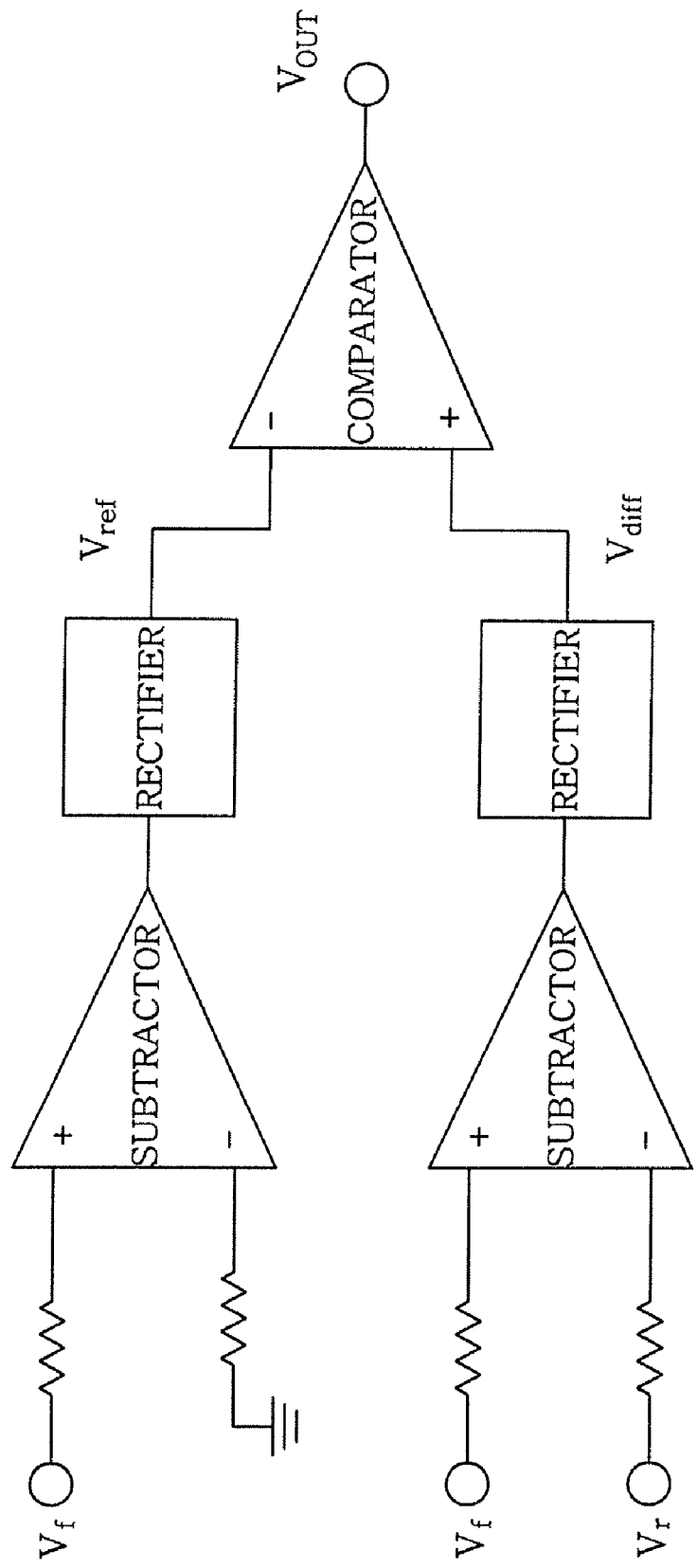
FIG. 8A shows a simplified block diagram of a phase detector for detecting the phase of a reflection coefficient in accordance with a representative embodiment.
Figure 8B:
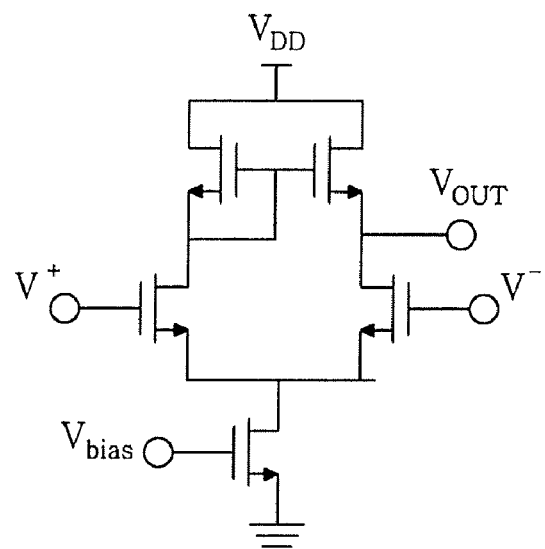
FIG. 8B shows a simplified schematic diagram of a phased detector in accordance with a representative embodiment.
Figure 8C:
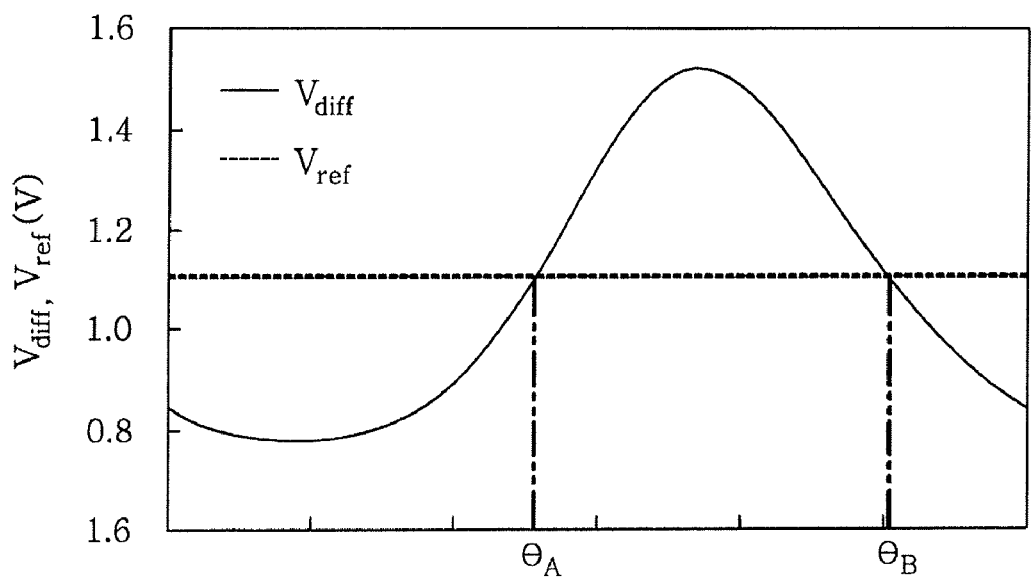
FIG. 8C presents relationships between the phase of the reflection coefficient and $V_{ref}$ and the phase and $V_{diff}$, said $V_{ref}$ and $V_{diff}$ being derived from an incident and a reflected signal components, respectively.
Figure 8D:
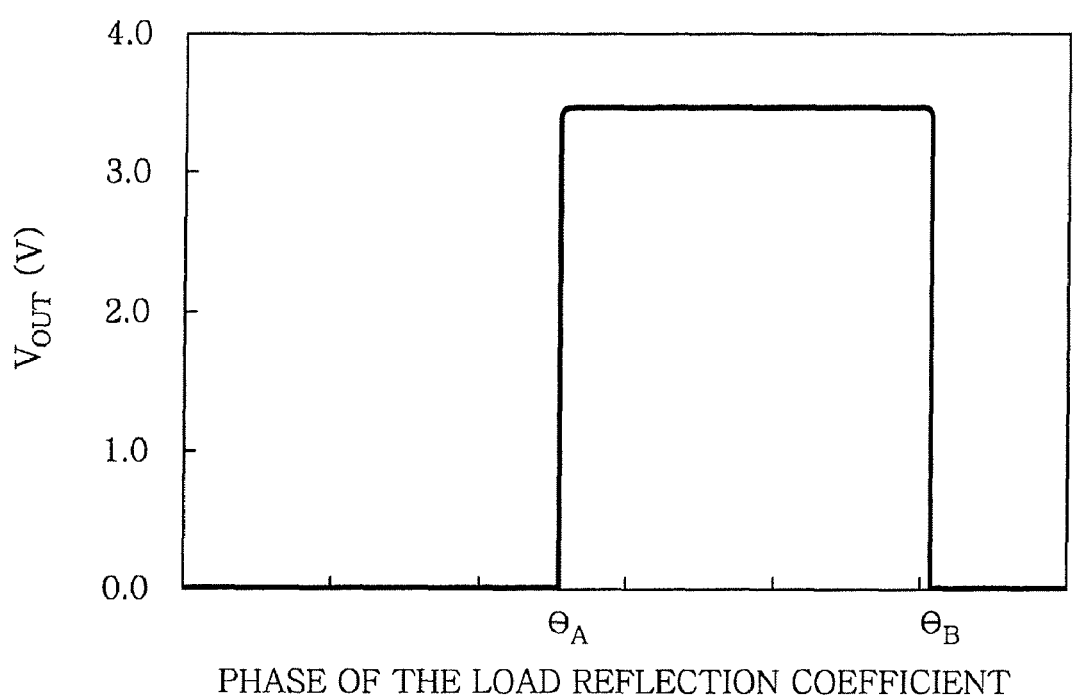
FIG. 8D provides a relationship between the phase of the reflection coefficient and $V_{out}$ obtained from a comparison between $V_{diff}$ with $V_{ref}$.
Figure 9:
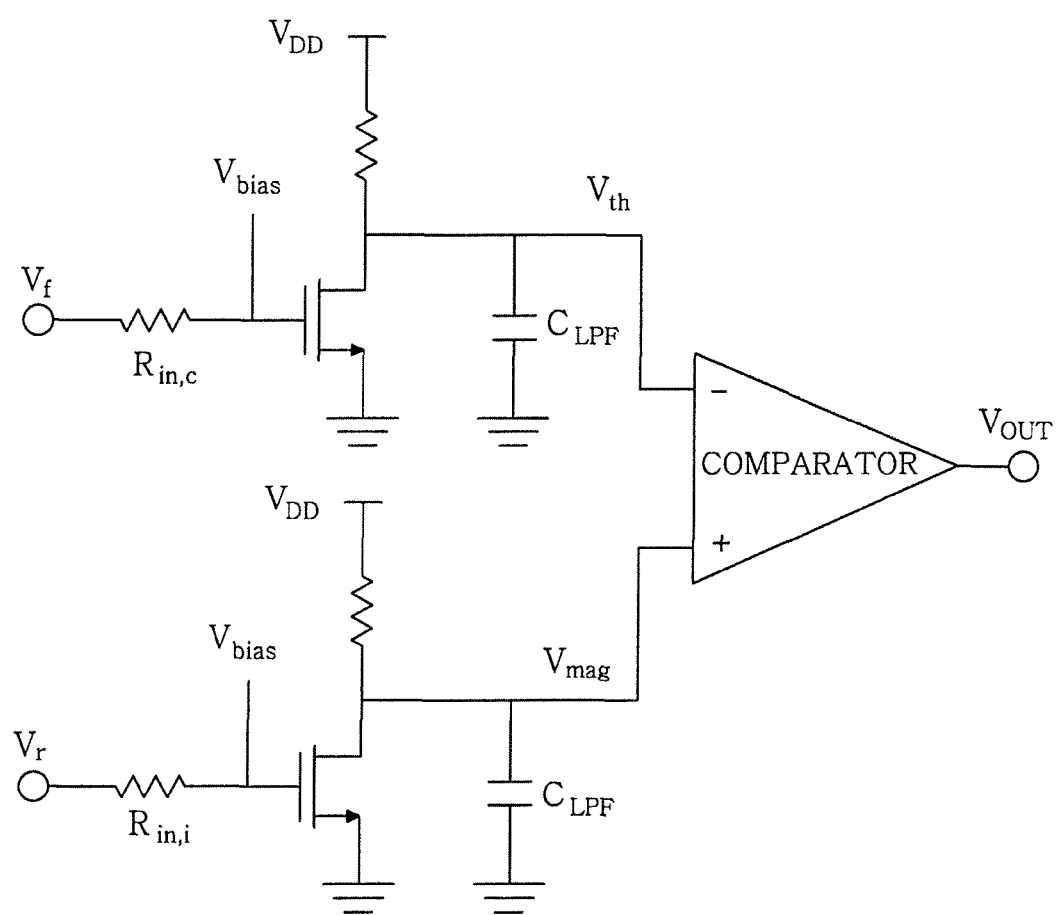
FIG. 9 represents a magnitude detector for detecting a magnitude of a reflection coefficient in accordance with a representative embodiment.

Referring to FIGS. 1, 8 and 9, an exemplary circuit construction of the directional coupler 120 and the mismatch detector 110 in accordance with representative embodiments are described below.

As shown in FIG. 1, the directional coupler 120 transmits $V_f$ and $V_r$, which are the results of sampling the incident signal 121 and the reflection signal 122, respectively, to the mismatch detector 110. The mismatch detector, configured to measure a reflection coefficient, includes a phase detector 113 for measuring the phase of the reflection coefficient and a magnitude detector 114 for measuring the magnitude of the reflection coefficient.

FIG. 8A shows an example of the phase detector 113. $V_f$ and a ground potential are connected to the non-inverting and the inverting input ports of a first subtractor in the phase detector 113, respectively. Also, $V_f$ and $V_r$ are connected to the non-inverting and the inverting input ports of a second subtractor, respectively. Output signals of the first and the second subtractors are respectively inputted to a first and a second rectifiers. Then, output signals $V_{ref}$ and $V_{diff}$ of the first and the second rectifiers are respectively inputted to the inverting and the non-inverting input ports of a comparator, and the comparator outputs an output signal $V_{out}$.

$V_f$ and $V_r$ respectively denote outputs from a coupling port and an isolation port of the directional coupler 120 shown in FIG. 1. Therefore, while the phase of $V_f$ does not vary, that of $V_r$ varies depending on the surrounding condition of the antenna 300. A DC signal, $V_{diff}$, can be obtained by subtracting $V_r$ from $V_f$, and rectifying, amplifying and filtering the subtraction result. In case where the phases of $V_f$ and $V_r$ are the same, the output of the second subtractor would be minimum and, therefore, $V_{diff}$ would be also minimum. In contrast, in case where the difference in phase between $V_f$ and $V_r$ is 180°, the output of the second subtractor would be maximum and, therefore, $V_{diff}$ would be also maximum. Therefore, based on such relationship between the phase difference of the incident and the reflected signals and the DC signal $V_{diff}$, the phase of the reflection coefficient can be determined from the voltage $V_{diff}$ as indicated in FIG. 8C.

Furthermore, another DC signal, $V_{ref}$, obtained by rectifying, amplifying and filtering the output of the first subtractor has a voltage corresponding to the reference phases $\theta_A$ an $\theta_B$. Since comparison of magnitudes of $V_{diff}$ and $V_{ref}$ can be translated into comparison of the phases of $V_{diff}$ and $V_{ref}$, when $V_{diff}$ is higher than $V_{ref}$ as shown in FIG. 8C, the phase of the reflection coefficient would be determined to be located between the reference phases. That is, $V_{ref}$ is used as a reference for $V_{diff}$ so as to select a specific phase range. $\theta_A$ and $\theta_B$ can be simply changed by replacing $V_f$ with another voltage, varying the magnitude of $V_f$ by connecting a resistance to the first subtractor, or adjusting the value of an internal resistor of the first rectifier.

The comparator shown in FIG. 8A compares $V_{diff}$ with $V_{ref}$ and outputs a high signal, for example, whose voltage may be the same as $V_{DD}$ shown in FIG. 8B, if $V_{diff}$ is higher than $V_{ref}$. This means that when the phase of the reflected signal is located between $\theta_A$ and $\theta_B$, the high signal is outputted as $V_{out}$, as shown in FIG. 8D. Accordingly, $V_{out}$ may be used as an indicator as to whether the reflection coefficient has a phase which lies between $\theta_A$ and $\theta_B$.

This operation may be implemented using a differential-to-single ended transformer depicted in FIG. 8B and the rectifiers of FIG. 8A.

FIG. 9 shows an exemplary magnitude detector 114. The magnitude detector 114 includes a first transistor with a gate which receives $V_f$ and a second transistor with a gate which receives $V_r$. The first and the second transistors outputs $V_{th}$ and $V_{mag}$, respectively, and $V_{th}$ and $V_{mag}$ are inputted to an inverting and a non-inverting input ports of a comparator, respectively. When $V_{mag}$ is higher than $V_{th}$, outputted from the comparator is a high signal, $V_{out}$, indicating that the reflection coefficient has a magnitude outside the reference ACPR X.

$V_{out}$ of the phase detector 113 shown in FIGS. 8A and $V_{out}$ of the magnitude detector 114 shown in FIG. 9 are inputted to a controller 112 of the mismatch detector 110, for example, a simple circuit formed of a logic gate such as an AND gate or a NAND gate.

A digital signal which is an output of the mismatch detector 110, specifically, of the controller 112, serves as the feedback control signal 111 to manipulate the impedance matching circuit 130. For example, when $V_{out}$ of the phase detector 113 and $V_{out}$ of the magnitude detector 114 are all high signals and are inputted to an AND gate, the output of the AND gate will be also a high signal, so that the shunt capacitor 132 shown in FIG. 5 is connected to both the transmission line 400 and ground by manipulating the matching circuit 130 using the output as the feedback control signal 111.

In accordance with the present teachings, it is not necessary to calculate the accurate phase and the accurate magnitude of the reflection coefficient; it suffices to perform the simple task of determining whether the reflection coefficient belongs to the comparatively poor linearity region or the comparatively good linearity region. Beneficially, and unlike the conventional technology which requires a complicated circuit configuration to accurately calculate the reflection coefficient, in accordance with representative embodiments, the reflection coefficient is determined using a comparatively simple circuit configuration.

Further, in accordance with the present teachings, a reflection coefficient of a high-frequency signal transmitter can be moved from a comparatively poor linearity region to a comparatively good linearity region on a Smith chart using a simple element (e.g., a single capacitor), to thereby render it possible to improve the linearity of the signal transmitter by using a small-sized and cost-effective product.

Furthermore, since the reflection coefficient can be moved on a Smith chart by connecting a capacitor to a transmission line in a region having wide ACPR contour intervals, there is the advantage of constructing a signal transmitter circuit which is highly reliable due to its insensitivity to changes in the environment around the antenna.

In addition, the mismatch detector of the present teachings is required to determine only whether the measured reflection coefficient is located in a comparatively poor linearity region or not; therefore, it can be implemented with a simple configuration and design.

In accordance with representative embodiments, methods and apparatuses for providing impedance matching for high frequency signal transmitter are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A method for improving a linearity of a high-frequency signal transmitter including a power amplifier, an antenna, a transmission line for transferring a high-frequency signal from the power amplifier to the antenna, and an impedance matching circuit connected to the transmission line, the method comprising:
   designating a comparatively poor linearity region and a comparatively good linearity region by dividing a Smith chart into the two regions based on Adjacent Channel Power Ratio (ACPR) contours drawn on the Smith chart at a point on the transmission line where the impedance matching circuit is connected;
   measuring a time-dependent reflection coefficient of the high-frequency signal transmitter in terms of a phase and a magnitude;
   determining whether the reflection coefficient is located in the comparatively poor linearity region or the comparatively good linearity region; and
   based on a result of the determining, improving the linearity of the high-frequency signal transmitter.

2. The method of claim 1, wherein the designating a comparatively poor and a comparatively good linearity regions comprises:
   determining a reference ACPR contour among the ACPR contours, a first reference phase and a second reference phase, which is greater than the first reference phase;
   designating a region on the Smith chart having magnitudes which lie outside the reference ACPR contour and having phases which lie between the first and the second reference phases as the comparatively poor linearity region; and
   designating a remaining region on the Smith chart as the comparatively good linearity region.

3. The method of claim 2, wherein the measuring a reflection coefficient comprises:
   sampling the high-frequency signal transferred from the power amplifier to the antenna to obtain a sampled incident signal;

sampling a reflection signal reflected from the antenna and proceeding to the power amplifier to obtain a sampled reflection signal;

subtracting the sampled reflection signal from the sampled incident signal;

rectifying the subtraction result to obtain a phase comparison voltage;

rectifying the sampled incident signal to obtain a phase reference voltage; and comparing the phase comparison voltage with the phase reference voltage, and, when the phase comparison voltage is higher than the phase reference voltage, generating a phase signal indicating that the reflection coefficient has a phase lying between the first and the second reference phases.

4. The method of claim 3, wherein the measuring a reflection coefficient further comprises:

inputting the sampled reflection signal to a gate terminal of a first transistor to obtain a magnitude comparison voltage;

inputting the sampled incident signal to a gate terminal of a second transistor to obtain a magnitude reference voltage; and comparing the magnitude comparison voltage with the magnitude reference voltage, and, when the magnitude comparison voltage is higher than the magnitude reference voltage, generating a magnitude signal indicating that the reflection coefficient has a magnitude lying outside the reference ACPR contour.

5. The method of claim 4, wherein the improving a linearity of the high-frequency signal transmitter comprises:

when both the phase signal and the magnitude signal are generated to indicate that the reflection coefficient is located in the comparatively poor linearity region, generating and transmitting a feedback control signal to the impedance matching circuit; and moving the reflection coefficient from the comparatively poor linearity region to the comparatively good linearity region in response to the feedback control signal to improve the linearity of the high-frequency signal transmitter.

6. The method of claim 4, wherein the improving a linearity of the high-frequency signal transmitter comprises:

when at least one of the phase signal and the magnitude signal is not generated to indicate that the reflection coefficient is located in the comparatively good linearity region, returning to the step of measuring a reflection coefficient, configured to vary with time, so as to ensure the linearity of the high-frequency signal transmitter.

7. A high-frequency signal transmitter, comprising:

a power amplifier configured to supply a high-frequency signal;

an antenna configured to transmit the high-frequency signal;

a transmission line configured to transfer the high-frequency signal from the power amplifier to the antenna;

an impedance matching circuit connected to the transmission line; and a mismatch detector configured to: designate a comparatively poor linearity region and a comparatively good linearity region by dividing a Smith chart into the two regions based on Adjacent Channel Power Ratio (ACPR) contours drawn on the Smith chart at a point on the transmission line where the impedance matching circuit is connected; to measure a time-dependent reflection coefficient of the high-frequency signal transmitter in terms of a phase and a magnitude; to determine whether the reflection coefficient is located in the comparatively poor linearity region or the comparatively good linearity region; and based on a result of the determination, to improve the linearity of the high-frequency signal transmitter.

8. The high-frequency signal transmitter of claim 7, wherein the comparatively poor and the comparatively good linearity regions are designated by determining a reference ACPR contour among the ACPR contours, a first reference phase and a second reference phase, which is greater than the first reference phase; designating a region on the Smith chart having magnitudes which lie outside the reference ACPR contour and having phases which lie between the first and the second reference phases as the comparatively poor linearity region; and designating the remaining region on the Smith chart as the comparatively good linearity region.

9. The high-frequency signal transmitter of claim 8, wherein the mismatch detector comprises:

a directional coupler for sampling the high-frequency signal transferred from the power amplifier to the antenna to output a sampled incident signal and sampling a reflection signal reflected from the antenna and proceeding to the power amplifier to output a sampled reflection signal; and a phase detector comprising a subtractor configured to subtract the sampled reflection signal from the sampled incident signal, a first rectifier configured to rectify the sampled incident signal and to output a phase reference voltage, a second rectifier configured to rectify an output signal of the subtractor and to output a phase comparison voltage, and a phase comparator configured to compare the phase comparison voltage with the phase reference voltage, and, when the phase comparison voltage is higher than the phase reference voltage, to generate a phase signal indicating that the reflection coefficient has a phase lying between the first and the second reference phases.

10. The high-frequency signal transmitter of claim 9, wherein the mismatch detector further includes a magnitude detector having a first transistor comprising a gate terminal which receives the sampled reflection signal to output a magnitude comparison voltage, a second transistor comprising a gate terminal which receives the sampled incident signal to output a magnitude reference voltage, and a magnitude comparator configured to compare the magnitude comparison voltage with the magnitude reference voltage and, when the magnitude comparison voltage is higher than the magnitude reference voltage, to generate a magnitude signal indicating that the reflection coefficient has a magnitude lying outside the reference ACPR contour.

11. The high-frequency signal transmitter of claim 10, wherein, when both the phase signal and the magnitude signal are generated to indicate that the reflection coefficient is located in the comparatively poor linearity region, the mismatch detector generates and transmits a feedback control signal to the impedance matching circuit, and the impedance matching circuit moves the reflection coefficient from the comparatively poor linearity region to the comparatively good linearity region in response to the feedback control signal so as to improve the linearity of the high-frequency signal transmitter.

12. The high-frequency signal transmitter of claim 11, wherein the impedance matching circuit comprises a shunt capacitor, and the transmission line is grounded through the shunt capacitor in response to the feedback control signal so as to move the reflection coefficient from the comparatively poor linearity region to the comparatively good linearity region along a conductance circle on the Smith chart in a clockwise direction.

* * * * *